(12) United States Patent
Tomisawa et al.

(10) Patent No.: US 7,551,116 B2
(45) Date of Patent: Jun. 23, 2009

(54) SEMICONDUCTOR INTEGRATED CIRCUIT PERFORMING A VOLTAGE COMPARISON AND PREVENTING DETERIORATION OF A VOLTAGE COMPARISON ACCURACY

(75) Inventors: Jun Tomisawa, Chiyoda-ku (JP); Kazuyasu Nishikawa, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/951,541

(22) Filed: Dec. 6, 2007

(65) Prior Publication Data
US 2008/0143577 A1    Jun. 19, 2008

(30) Foreign Application Priority Data
Dec. 15, 2006    (JP)    ............................. 2006-338857

(51) Int. Cl.
H03M 1/34    (2006.01)
(52) U.S. Cl. ...................... 341/165; 341/172; 341/161; 341/155; 341/169
(58) Field of Classification Search ................. 341/161, 341/165, 155, 169, 172, 163; 327/65, 89, 327/69, 64
See application file for complete search history.

(56) References Cited

U.S. PATENT DOCUMENTS

| | | | | |
|---|---|---|---|---|
| 4,553,052 A | * | 11/1985 | Takahashi | 327/65 |
| 4,965,468 A | * | 10/1990 | Nicollini et al. | 327/89 |
| 5,113,090 A | * | 5/1992 | Imaizumi et al. | 327/69 |
| 5,148,166 A | * | 9/1992 | Ribner | 341/143 |
| 5,546,028 A | * | 8/1996 | Yamaguchi | 327/64 |
| 5,812,079 A | * | 9/1998 | Ito et al. | 341/163 |
| 6,630,898 B1 | * | 10/2003 | Stegers | 341/172 |
| 6,677,880 B2 | * | 1/2004 | Yamamoto | 341/169 |
| 7,075,470 B2 | * | 7/2006 | Lee | 341/155 |
| 2002/0196173 A1 | * | 12/2002 | Yamamoto | 341/165 |
| 2007/0290915 A1 | * | 12/2007 | Morimoto | 341/161 |

FOREIGN PATENT DOCUMENTS

| | | |
|---|---|---|
| JP | 9-512684 | 12/1997 |
| JP | 11-150454 | 6/1999 |
| JP | 2001-189633 | 7/2001 |
| WO | WO 95/30271 | 11/1995 |

* cited by examiner

Primary Examiner—Jean B Jeanglaude
(74) Attorney, Agent, or Firm—Oblon, Spivak, McClelland, Maier & Neustadt, P.C.

(57) ABSTRACT

A semiconductor integrated circuit includes a differential amplifier circuit receiving first and second input voltages, a latch circuit comparing a voltage received from a first output terminal of the differential amplifier circuit through a first capacitor and a voltage received from the second output terminal of the differential amplifier circuit through a second capacitor and providing a digital signal representing a result of a comparison between the first and second input voltages, and a third capacitor having a first terminal coupled to a second terminal of the first capacitor and a second terminal coupled to a second terminal of the second capacitor.

4 Claims, 11 Drawing Sheets

SEMICONDUCTOR INTEGRATED CIRCUIT PERFORMING A VOLTAGE COMPARISON AND PREVENTING DETERIORATION OF A VOLTAGE COMPARISON ACCURACY

BACKGROUND OF THE INVENTION

1. Field of the Invention

The invention relates to a semiconductor integrated circuit, and particularly to an accurate comparator circuit preventing deterioration of a voltage comparison accuracy.

2. Description of the Background Art

In recent years, analog/digital-mixed integrated circuits that have analog circuits integrated in digital integrated circuits of a CMOS (Complementary Metal Oxide Semiconductor) process have been increasingly employed, and analog-to-digital converter (ADC) circuits serving as interfaces for connection between the analog and digital circuits have increased in importance. The ADC circuits can be classified under various types such as a successive approximation type, a pipeline type, a flash type, a $\Sigma\Delta$ type and a dual integration type. In any one of these types, a voltage comparing operation is required, and a comparator circuit is essential. There is a tendency to increase a resolution of the ADC circuit incorporated into a CMOS analog/digital mixed integrated circuit such as a sensor. This increases a necessity for employing a comparator circuit having a high voltage comparison accuracy.

For example, Japanese Patent Laying-Open Nos. 2001-189633 (Patent Document 1) and 11-150454 (Patent Document 2) as well as PCT National Publication No. 09-512684 (Patent Document 3) have disclosed comparator circuits used in analog-to-digital converter circuits and the like.

The comparator circuit disclosed in the Patent Document 1 is of an OOS (Output Offset Storage) type. The OOS type of comparator circuit includes an amplifier circuit, a latch circuit and a capacitor. This OOS type of comparator circuit performs an correcting operation on an offset voltage of the amplifier circuit before a voltage comparing operation. More specifically, two capacitors connected to respective differential outputs of the amplifier circuit accumulate charges corresponding to a value obtained by multiplying the offset voltage of the amplifier circuit by a gain of the amplifier circuit.

In the voltage comparing operation, two input voltages to be compared are applied to the amplifier circuit. The amplifier circuit amplifies the two input voltages, and outputs them. In this operation, the two capacitors cancel the offset voltage in the output voltages of the amplifier circuit, and the voltages not including the offset voltage can be obtained. The output voltage of the amplifier circuit is provided to the latch, which converts it into a logic level of H- or L-level, and outputs it as a result of the comparison.

In the comparator circuit disclosed in the Patent Document 1, no problem arises when the comparator circuit receives the comparison target voltages of a minute voltage difference. However, when the comparator circuit receives the comparison target voltages of a large voltage difference, the voltages held by the two capacitors lower, and the accuracy of the offset voltage correction deteriorates.

SUMMARY OF THE INVENTION

An object of the invention is to provide a semiconductor integrated circuit that can prevent deterioration of an accuracy of offset voltage correction, and thereby can improve a voltage comparison accuracy.

A semiconductor integrated circuit according to an aspect of the invention includes a first differential amplifier circuit having a first input terminal receiving a first input voltage, a second input terminal receiving a second input voltage, a first output terminal and a second output terminal; a first capacitor having a first terminal coupled to the first output terminal of the first differential amplifier circuit and a second terminal; a second capacitor having a first terminal coupled to the second output terminal of the first differential amplifier circuit and a second terminal; a first switch having a first terminal coupled to the second terminal of the first capacitor and a second terminal receiving a predetermined voltage, and selecting connection and disconnection of the first and second terminals of the first switch; a second switch having a first terminal coupled to the second terminal of the second capacitor and a second terminal receiving a predetermined voltage, and selecting connection and disconnection of the first and second terminals of the second switch; a third capacitor having a first terminal coupled to the second terminal of the first capacitor and a second terminal coupled to the second terminal of the second capacitor; and a latch circuit comparing a voltage received from the first output terminal of the first differential amplifier circuit through the first capacitor and a voltage received from the second output terminal of the first differential amplifier circuit through the second capacitor and providing a digital signal representing a result of a comparison between the first and second input voltages.

A semiconductor integrated circuit according to another aspect of the invention includes a first capacitor having a first terminal receiving a first input voltage and a second terminal; a second capacitor having a first terminal receiving a second input voltage and a second terminal; a differential amplifier circuit having a first terminal coupled to the second terminal of the first capacitor, a second input terminal coupled to the second terminal of the second capacitor, a first output terminal and a second output terminal; a first switch having a first terminal coupled to the second terminal of the first capacitor and a second terminal coupled to the first output terminal of the differential amplifier circuit, and selecting connection and disconnection of the first and second terminals of the first switch; a second switch having a first terminal coupled to the second terminal of the second capacitor and a second terminal coupled to the second output terminal of the differential amplifier circuit, and selecting connection and disconnection of the first and second terminals of the second switch; a third capacitor having a first terminal coupled to the first input terminal of the differential amplifier circuit and a second terminal coupled to the second input terminal of the differential amplifier circuit; and a latch circuit comparing a voltage received from the first output terminal of the differential amplifier circuit and a voltage received from the second output terminal of the differential amplifier circuit and providing a digital signal representing a result of a comparison between the first and second input voltages.

The invention can prevent deterioration of an accuracy of offset voltage correction, and thereby can improve a voltage comparator accuracy.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the figures, the same or corresponding portions bear the same reference numbers, and description thereof is not repeated.

First Embodiment

[Structure and Basic Operation]

Figure 1:
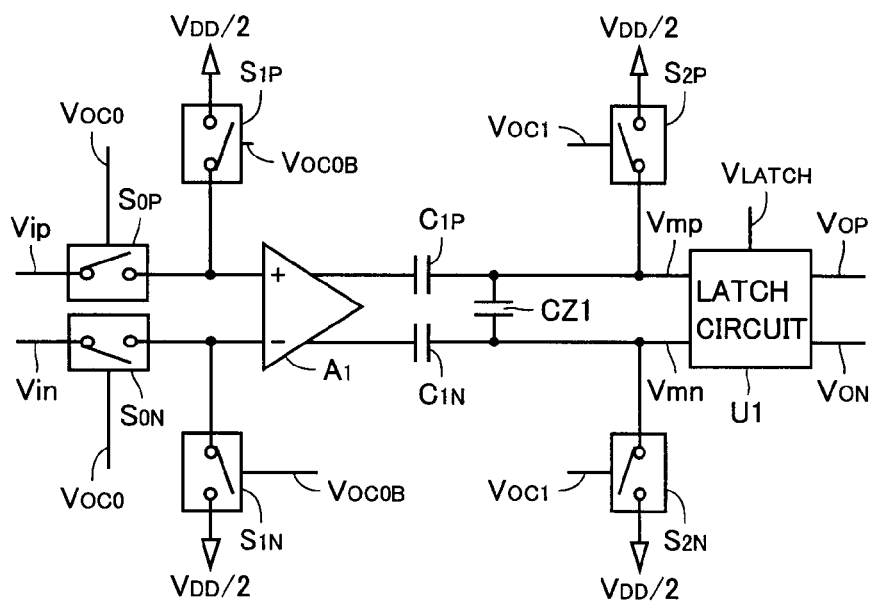
FIG. 1 shows a structure of a semiconductor integrated circuit according to a first embodiment of the invention.

FIG. 1 shows a structure of a semiconductor integrated circuit according to a first embodiment of the invention.

Referring to FIG. 1, a semiconductor integrated circuit 101 is an OSS type comparator circuit, and includes an amplifier circuit (differential amplifier circuit) A1, capacitors (first, second and third capacitors) C1P, C1N and CZ1, switches S0P and S1P, a switch (first switch) S2P, switches S0N and S1N, a switch (second switch) S2N and a latch circuit U1. Each of switches S0P-S2P and S0N-S2N may be implemented by, e.g., a N-channel MOS transistor, a P-channel MOS transistor or a complementary switch formed of a combination of N- and P-channel MOS transistors.

Switch S0P has a first terminal receiving an input voltage Vip and a second terminal connected to a positive-phase input terminal (first input terminal) of amplifier circuit A1 and a first terminal of switch S1P.

Switch S0N has a first terminal receiving an input voltage Vin and a second terminal connected to an reverse-phase input terminal (second input terminal) of amplifier circuit A1 and a first terminal of switch S1N.

Capacitor C1P has a first terminal connected to a positive-phase output terminal (first output terminal) of amplifier circuit A1 and a second terminal connected to a first terminal of capacitor CZ1, the first terminal of switch S2P and a positive-phase input terminal of latch circuit U1.

Capacitor C1N has a first terminal connected to a reverse-phase output terminal (second output terminal) of amplifier circuit A1, a second terminal connected to a second terminal of capacitor CZ1, a first terminal of switch S2N and a reverse-phase input terminal of latch circuit U1.

Second terminals of switches S1P, S2P, S1N and S2N receive a voltage equal to half a fixed voltage VDD.

Switches S0P and S0N are turned on/off based on a control voltage VOC0, and thus selectively connect and disconnect the first and second terminals. Switches S1P and S1N are turned on/off based on a control voltage VOC0B. Switches S2P and S2N are turned on/off based on a control voltage VOC1. In the following description, switches S0P-S2P and S0N-S2N are turned on when the control voltage is at a logically high level (which will also be referred to as an "H-level" hereinafter), and are turned off when the control voltage is at a logically low level (which will also be referred to as an "L-level" hereinafter).

Amplifier circuit A1 amplifies input voltage Vip received via switch S0P and input voltage Vin received via switch S0N, and outputs them.

Latch circuit U1 performs a comparison between a voltage Vmp received from the positive-phase output terminal of amplifier circuit A1 through capacitor C1P and a voltage Vmn received from the reverse-phase output terminal of amplifier circuit A1 through capacitor C1N, holds a digital signal at the H- or L-level indicative of a result of the comparison and provides it as output voltages VOP and VON.

Figure 2:
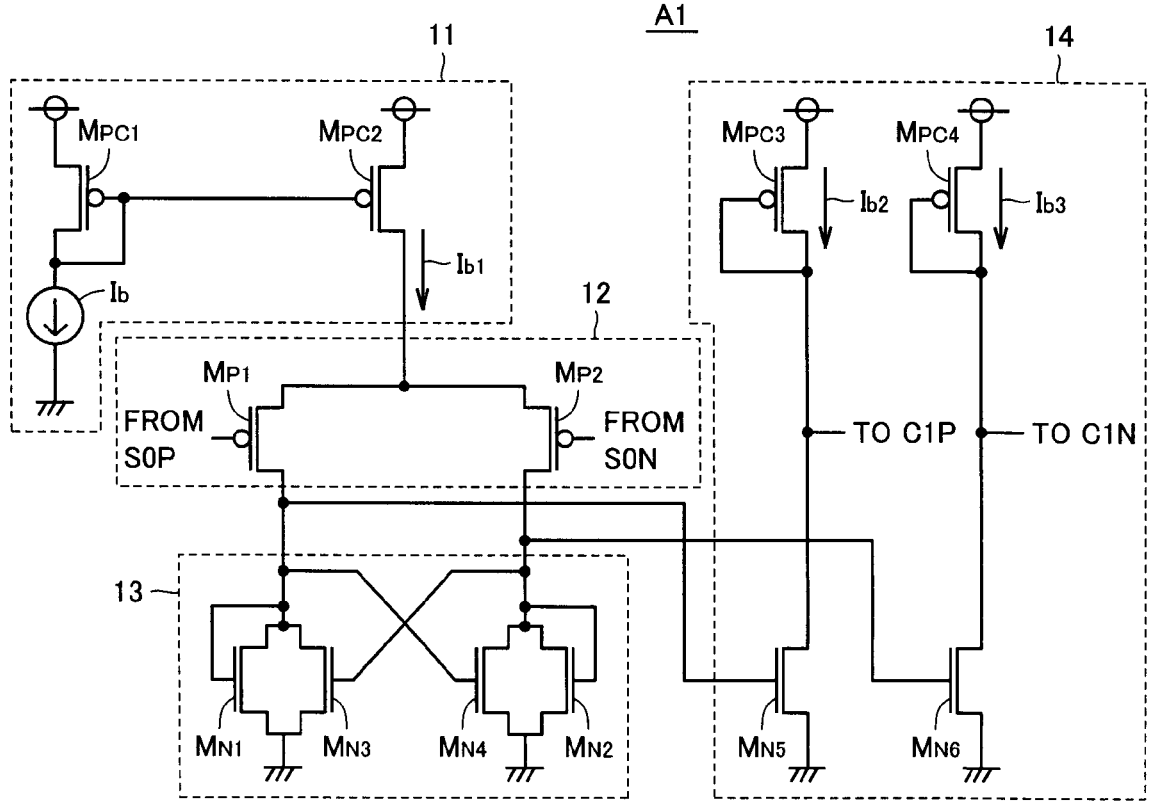
FIG. 2 shows a structure of an amplifier circuit A1 in the semiconductor integrated circuit according to the first embodiment of the invention.

FIG. 2 shows a structure of amplifier circuit A1 in the semiconductor integrated circuit according to the first embodiment of the invention.

Referring to FIG. 2, amplifier circuit A1 has a two-stage structure, includes a bias circuit 11, differential input circuit 12 and a load circuit 13 that form a first stage, and also includes an output buffer circuit 14 forming a second stage. Bias circuit 11 includes a current supply Ib and P-channel MOS transistors MPC1 and MPC2 forming a current mirror circuit. Differential input circuit 12 includes P-channel MOS transistors MP1 and MP2. Load circuit 13 includes N-channel MOS transistors MN1-MN4. Output buffer circuit 14 includes P-channel MOS transistors MPC3 and MPC4 as well as N-channel MOS transistors MN5 and MN6.

A gate of P-channel MOS transistor MP1 corresponds to the positive-phase input terminal of amplifier circuit A1. A gate of P-channel MOS transistor MP2 corresponds to the reverse-phase input terminal of amplifier circuit A1. A drain of P-channel MOS transistor MPC3 corresponds to the positive-phase output terminal of amplifier circuit A1. A drain of P-channel MOS transistor MPC4 corresponds to the reverse-phase output terminal of amplifier circuit A1.

In amplifier circuit A1, each MOS transistor has a gate length and a gate width that are adjusted such that amplifier circuit A1 may have a gain of a factor of about 10.

In differential input circuit 12 and load circuit 13 of amplifier circuit A1, symmetry of the circuits on the positive- and reverse-phase sides may be lost due to various variations in CMOS process. This equivalently results in a state that a voltage supply is added to one of the positive- and reverse-phase input terminals of amplifier circuit A1. The voltage value of the voltage supply thus added corresponds to an offset voltage of amplifier circuit A1.

Figure 3:
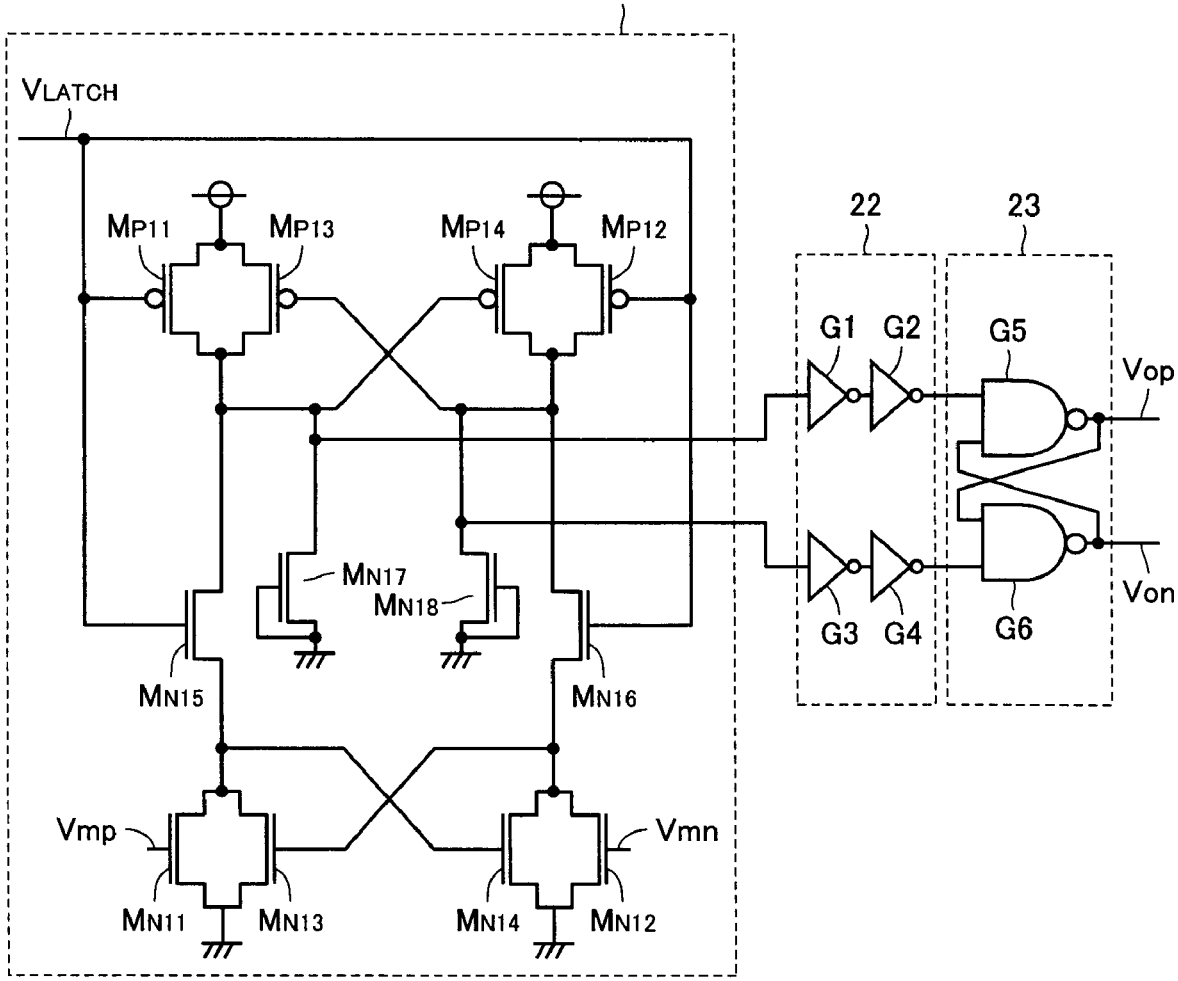
FIG. 3 shows a structure of a latch circuit U1 in the semiconductor integrated circuit according to the first embodiment of the invention.

FIG. 3 shows a structure of latch circuit U1 in the semiconductor integrated circuit according to the first embodiment of the invention.

Referring to FIG. 3, latch circuit U1 includes a latch circuit body 21, a buffer circuit 22 and a reset-set flip-flop circuit (RS flip-flop circuit) 23. Latch circuit body 21 includes P-channel MOS transistors MP11-MP14 and N-channel MOS transistors MN11-MN18. Buffer circuit 22 includes inverter circuits G1-G4. Reset-set flip-flop circuit 23 includes NAND circuits G5 and G6.

A gate of N-channel MOS transistor MN11 corresponds to the positive-phase input terminal of latch circuit U1. A gate of N-channel MOS transistor MN12 corresponds to the reverse-phase input terminal of latch circuit U1. Thus, the gates of N-channel MOS transistors MN11 and MN12 receive voltages Vmp and Vmn, respectively.

P-channel MOS transistors MP11 and MP12 as well as N-channel MOS transistors MN15 and MN16 start the latch operation based on a control voltage VLATCH.

P-channel MOS transistors MP13 and MP14 as well as N-channel MOS transistors MN13 and MN14 form a positive feedback circuit for rapidly determining the output voltages of latch circuit body 21.

N-channel MOS transistors MN17 and MN18 keep output voltages of latch circuit body 21 at constant levels when latch circuit U1 is not performing the latch operation.

Reset-set flip-flop circuit 23 holds the output voltages of latch circuit body 21 received through buffer circuit 22, and externally outputs them as voltages VOP and VON.

In latch circuit U1, voltages VOP and VON attain the H- and L-levels when voltage Vmp is larger than voltage Vmn, and voltages VOP and VON attain the L- and H-levels, respectively, when voltage Vmp is smaller than voltage Vmn.

[Operation]

Figure 4:
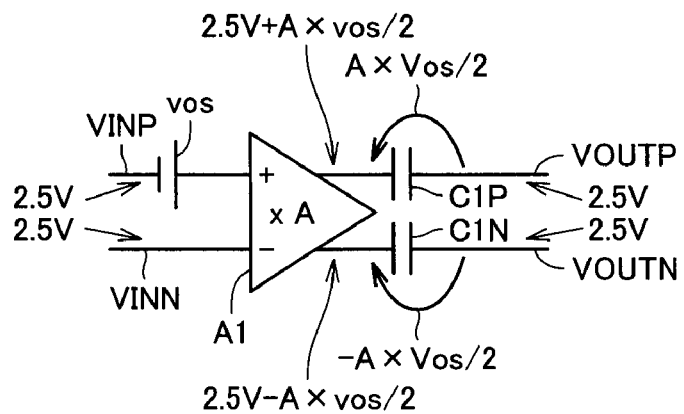
FIG. 4 illustrates a correcting operation for an offset voltage of the semiconductor integrated circuit according to the first embodiment of the invention.
Figure 5:
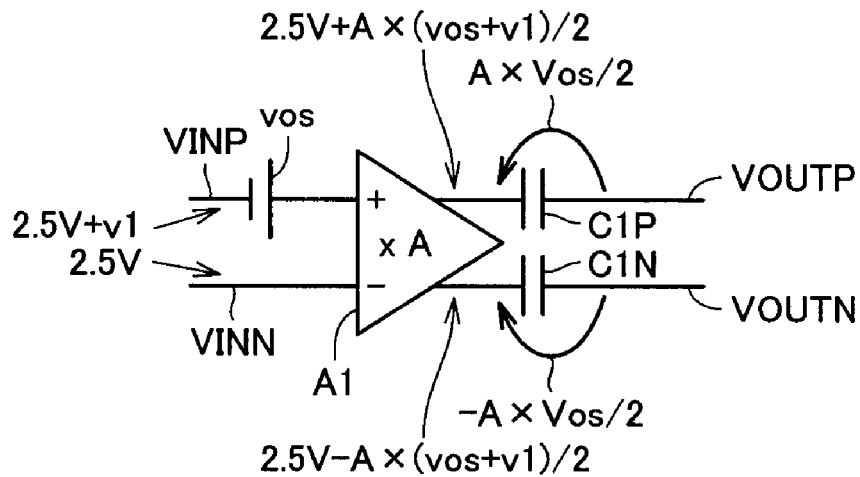
FIG. 5 illustrates a voltage comparing operation of the semiconductor integrated circuit according to the first embodiment of the invention.

FIG. 4 illustrates a correcting operation for the offset voltage of the semiconductor integrated circuit according to the first embodiment of the invention. FIG. 5 illustrates a voltage comparing operation of the semiconductor integrated circuit according to the first embodiment of the invention. In the following description, VINP and VINN represent the input voltages on the positive- and reverse-phase sides of amplifier circuit A1, respectively, VOUTP and VOUTN represent the output voltages on the positive- and reverse-phase sides of amplifier circuit A1, respectively, VOS represents an offset voltage of amplifier circuit A1 and A represents the gain of amplifier circuit A1.

Amplifier circuit A1 performs the amplifying operation to satisfy a relationship of (VOUTP−VOUTN=A×(VINP−VINN)). For the sake of simplicity, it is assumed that amplifier circuit A1 performs a differential operation, and the outputs of amplifier circuit A1 are balanced even when the inputs of amplifier circuit A1 are unbalanced.

Referring to FIG. 4, 2.5 V is applied to the differential inputs and the differential outputs of amplifier circuit A1 in the correcting operation. Thus, voltages VOUTN, VOUTP, VINP and VINN are set to 2.5 V. Thereby, capacitors C1P and C1N accumulate charges corresponding to (A×VOS/2) and (−A×VOS/2), respectively. Thus, capacitors C1P and C1N hold the voltage obtained by multiplying offset voltage VOS by gain A.

Referring to FIG. 5, when voltages of (2.5 V+V1(where V1 is an arbitrary voltage value) and 2.5 V are applied to the differential inputs of amplifier circuit A1, respectively, amplifier circuit A1 outputs voltages of (2.5 V+A×(VOS+V1)/2) and (2.5 V−A×(VOS+V1)/2) from its differential outputs, respectively. In the correcting operation and the voltage comparing operation, no change occurs in voltage between the terminals of capacitor C1P and in voltage between the terminals of capacitor C1N so that VOUTP becomes equal to (2.5 V+A×V1/2) and VOUTN becomes equal to (2.5 V−A×V1/2).

Figure 6:
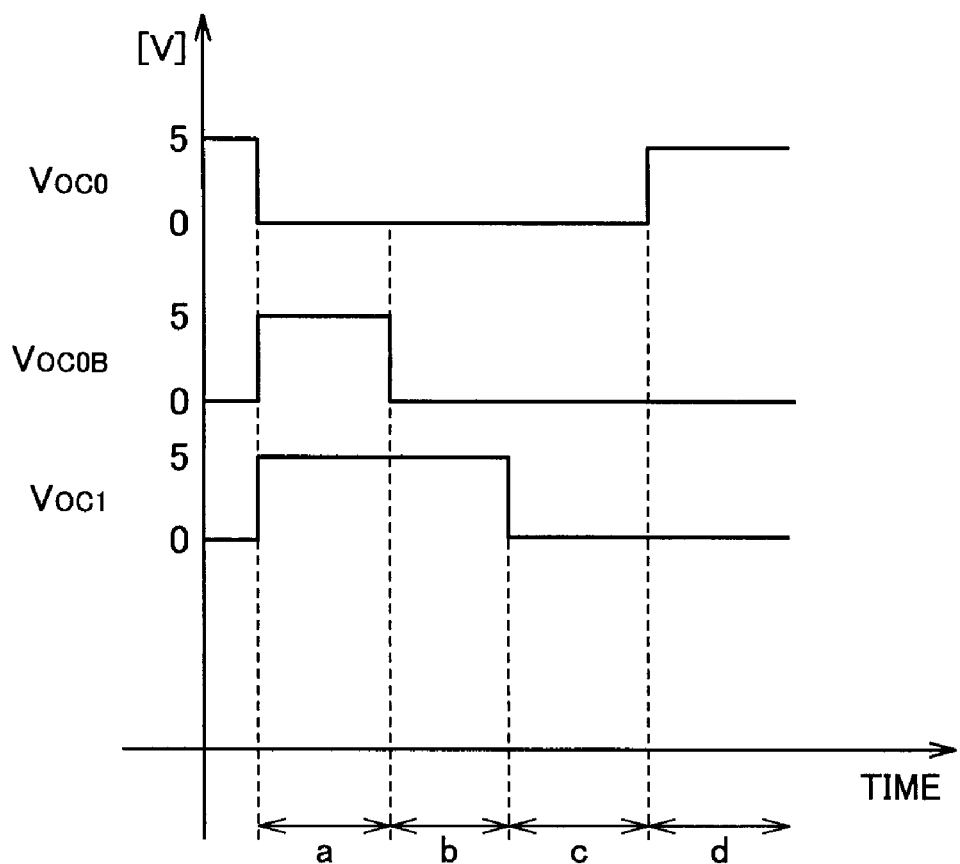
FIG. 6 is a waveform diagram illustrated an operation of the semiconductor integrated circuit according to the first embodiment of the invention.

FIG. 6 is a waveform diagram illustrating an operation of the semiconductor integrated circuit according to the first embodiment of the invention.

In a period a, the correcting operation for the offset voltage already described is performed. More specifically, control voltages VOC0, VOC0B and VOC1 attain the L-, H- and H-levels, respectively. Thereby, switches S0P and S0N are turned off, switches S1P and S1N are turned on and switches S2P and S2N are turned on so that VDD/2 is applied the differential inputs and the differential outputs of amplifier circuit A1. Therefore, capacitors C1P and C1N accumulate charges corresponding to the voltage obtained by multiplying the offset voltage of amplifier circuit A1 by the gain of amplifier circuit A1.

In a period b, control voltages VOC0, VOC0B and VOC1 attain the L-, L- and H-levels, respectively. Thereby, switches S1P and S1N change from the on state to the off state. Thus, switches S0P and S0N are off switches S1P and S1N are off and switches S2P and S2N are on. Therefore, the offset voltage of amplifier circuit A1 held by capacitors C1P and C1N is fixed.

In a period c, all control voltages VOC0, VOC0B and VOC1 attain the L-level. Thereby, switches S2P and S2N change from the on state to the off state. Thus, switches S0P and S0N are off, switches S1P and S1N are off, and switches S2P and S2N are off.

In a period d, control voltages VOC0, VOC0B and VOC1 attain the H-, L- and L-levels, respectively. Thereby, switches S0P and S0N change from the off state to the on state. Thus, switches S0P and S0N are on, switches S1P and S1N are off, and switches S2P and S2N are off. Thereby, semiconductor integrated circuit 101 can perform the voltage comparing operation on input voltages Vip and Vin.

Therefore, the semiconductor integrated circuit according to the first embodiment of the invention can cancel the offset voltage in the output voltages of amplifier circuit A1.

Figure 7:
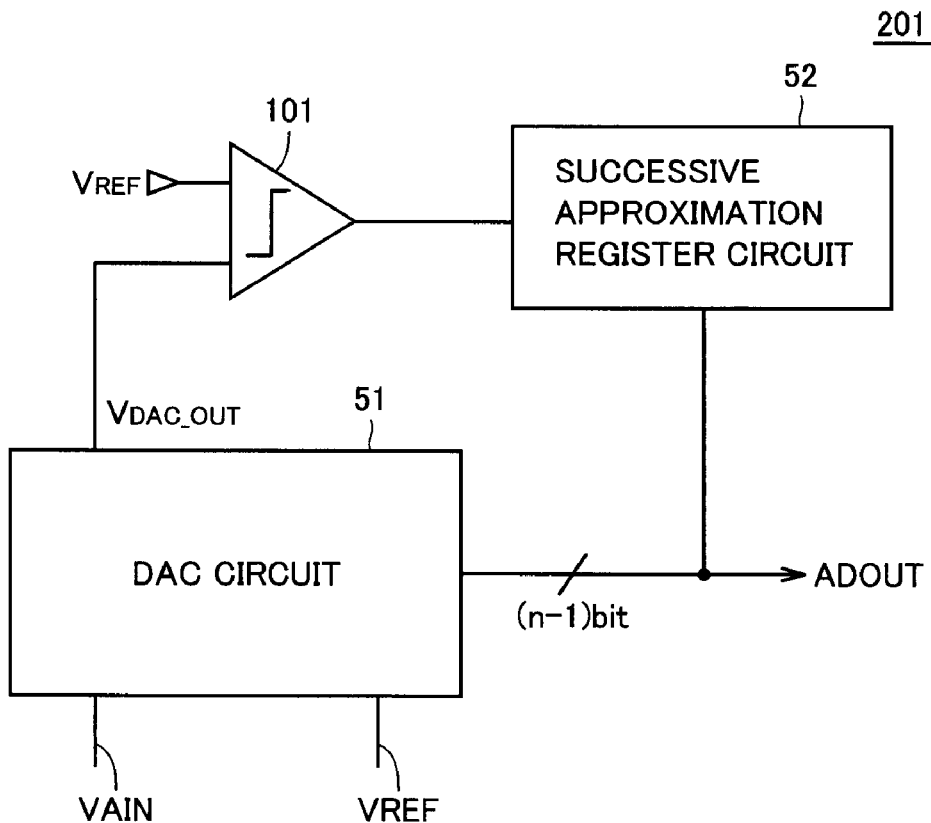
FIG. 7 shows a structure of an ADC circuit provided with the semiconductor integrated circuit according to the first embodiment of the invention.

FIG. 7 shows a structure of an ADC circuit provided with the semiconductor integrated circuit according to the first embodiment of the invention.

Referring to FIG. 7, an ADC circuit 201 is an successive approximation ADC circuit, and includes semiconductor integrated circuit 101, a DAC (digital-to-analog converter) circuit 51 and a successive approximation register circuit 52. VAIN is an analog input voltage of ADC circuit 201, VREF is a reference voltage of semiconductor integrated circuit 101 and DAC circuit 51 and VDAC_OUT is an output voltage of DAC circuit 51. ADC circuit 201 is included, e.g., in one semiconductor integrated circuit.

Figure 8:
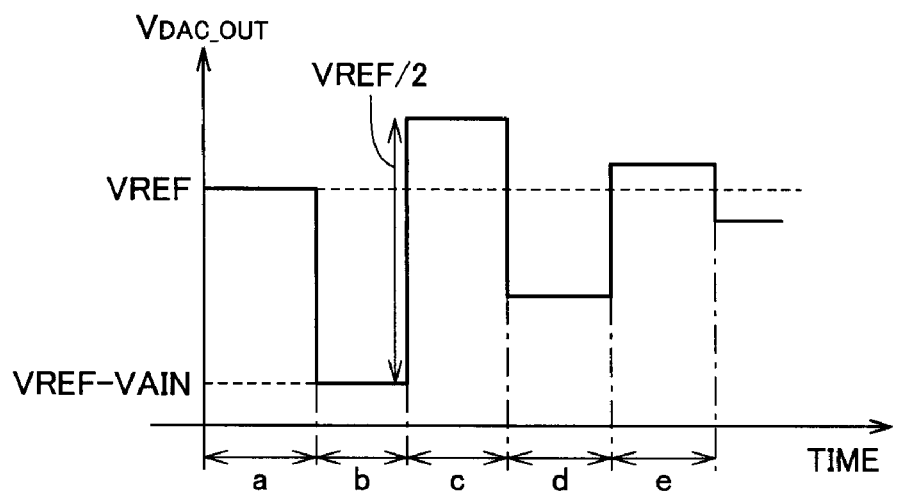
FIG. 8 is a waveform diagram of an output voltage of a DAC circuit 51 in an ADC circuit 201.

FIG. 8 is a waveform diagram of an output voltage of DAC circuit 51 in ADC circuit 201.

The operation of ADC circuit 201 can be divided into three operations, i.e., an initializing operation (period a), an operation of sampling the analog input voltage (period b) and a voltage comparing operation (period c and subsequent periods).

Referring to FIG. 8, successive approximation register circuit 52 is reset in period a, and all the (n−1) bits of data provided from successive approximation register circuit 52 become zero. Thereby, DAC circuit 51 outputs reference voltage VREF as its output voltage VDAC_OUT. In this operation, semiconductor integrated circuit 101 performs the correcting operation for the foregoing offset voltage, and cancels the offset voltage in the output voltage.

In period b, DAC circuit 51 is externally supplied with analog voltage VAIN, and output voltage VDAC_OUT of DAC circuit 51 becomes equal to (VREF−VAIN).

In period c, a first comparing operation is performed with the most significant bit of DAC circuit 51 set to an initial value of 1 and bits from (bn−2) to (b0) set to 0.

Assuming that b0−(bn−1) represent (n−1) bits of the data received by DAC circuit 51 from successive approximation register circuit 52, respectively, output voltage VDAC_OUT of DAC circuit 51 is represented by the following equation:

$$V_{DAC\_OUT} = V_{REF} - V_{IN} + \sum_{i=0}^{n-1} \left( \frac{b_i \times 2^i}{2^n} \right) \times V_{REF}$$

In period c, most significant bit (bn−1) is 1, and bits (bn−2)−(b0) are 0 so that output voltage VDAC_OUT of DAC circuit 51 is represented by the following equation:

$VDAC\_OUT = VREF - VAIN + VREF/2$

Semiconductor integrated circuit 101 compares this output voltage VDAC_OUT with reference voltage VREF, and provides a result of the comparison to successive approximation register circuit 52.

When output voltage VDAC_OUT is smaller than reference voltage VREF, successive approximation register circuit 52 sets most significant bit (bn−1) of the output data to 1, and then performs the next comparing operation. When output voltage VDAC_OUT is larger than reference voltage VREF, successive approximation register circuit 52 sets most significant bit (bn−1) of the output data to 0, and performs the next comparing operation. In the operation shown in FIG. 8, since output voltage VDAC_OUT is larger than reference voltage VREF, successive approximation register circuit 52 sets most significant bit (bn−1) of the output data to 0.

Successive approximation register circuit 52 performs similar comparing operations in and after period d, and it sets or determines the values of all the subsequent bits (bn−2)−(b0) of the output data. More specifically, successive approximation register circuit 52 sets bit (bn−2) of the output data to 1 in period d, and sets bit (bn−3) of the output data to 0 in a period e. Therefore, the successively comparing operation ends in a state where output voltage VDAC_OUT takes a maximum value not exceeding reference voltage VREF. The data of (n−1) bits that is output from successive approximation register circuit 52 when most least bit (b0) is set represents a value obtained by converting analog voltage VAIN into a digital value.

Referring to FIGS. 4 and 5 again, when a difference between voltages VINP and VINN, i.e., the differential input voltages of semiconductor integrated circuit 101 is small, the foregoing offset voltage correction operation is correctly performed. However, when a large difference is present between voltages VINP and VINN, capacitors C1P and C1N provide pulse currents (i.e., pulse-like currents) corresponding to edge components of the output amplitude of amplifier circuit A1. This pulse current flows from capacitor C1P to a parasitic capacitance of switch S2P that is in the off state during the voltage comparing operation, and also flows to capacitor C1N from a parasitic capacitance of switch S2N that is in the off state during the voltage comparing operation. The flowing of the pulse current lowers the offset voltages held by capacitors C1P and C1N, and the voltages for correcting the offset voltage of amplifier circuit A1 are lost.

Referring to FIG. 7 again, a similar phenomenon can be observed in ADC circuit 201.

The period in which the offset voltages held by capacitors C1P and C1N lower primarily matches with period in FIG. 8, i.e., the period for sampling analog voltage VAIN.

Referring to FIG. 8, output voltage VDAC_OUT of DAC circuit 51 rapidly changes from reference voltage VREF to (VREF−VAIN) at the time of change from period a to period b, and then rapidly changes from (VREF−VAIN) to (VREF−VAIN+VREF/2) at the time of change from period b to period c.

Since the output of DAC circuit 51 is connected to the input of semiconductor integrated circuit 101, the offset voltage correcting capability of semiconductor integrated circuit 101 deteriorates when the rapid voltage change occurs two times in or near period b.

When output voltage VDAC_OUT illustrated in FIG. 8 is provided to semiconductor integrated circuit 101, an offset voltage of about 10 mV occurs on the output side of amplifier circuit A1. Thus, the voltage comparing accuracy of semiconductor integrated circuit 101 arranged in ADC circuit 201 deteriorates during the operation of ADC circuit 201.

The above problem is overcome by the structure of the semiconductor integrated circuit according to the first embodiment of the invention, and this structure will now be described.

Figure 9:
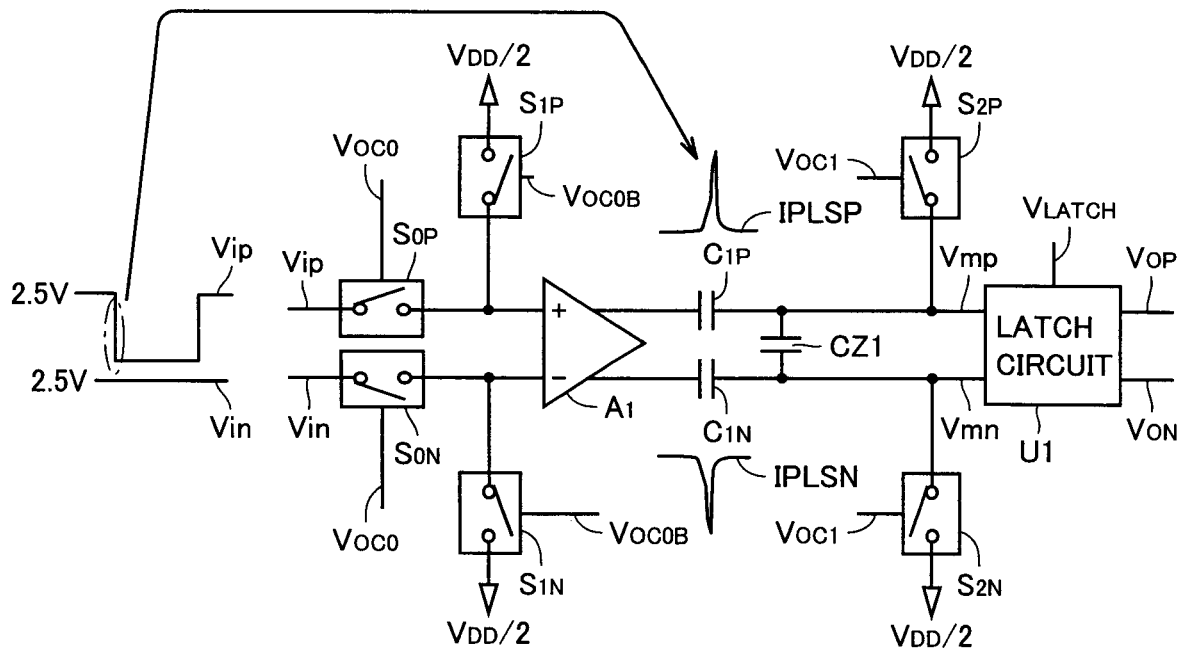
FIG. 9 illustrates an operation of a capacitor CZ1 in the semiconductor integrated circuit according to the first embodiment of the invention.

FIG. 9 illustrates an operation of capacitor CZ1 in the semiconductor integrated circuit according to the first embodiment of the invention.

Figure 10:
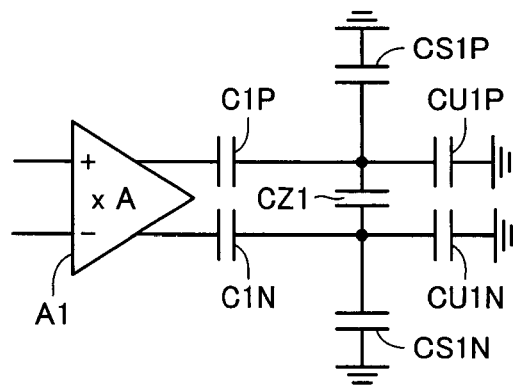
FIG. 10 illustrates input capacitances around capacitor CZ1 in the semiconductor integrated circuit according to the first embodiment of the invention.

FIG. 10 illustrates input capacitances around capacitor CZ1 in the semiconductor integrated circuit according to the first embodiment of the invention.

When semiconductor integrated circuit 101 receives, as the differential input voltages, pulse input voltage Vip and input voltage Vin for comparison illustrated in FIG. 9, pulse currents IPLSP and IPLSN corresponding to the edge components of pulse input voltage Vip are output from capacitors C1P and C1N, respectively.

However, in the semiconductor integrated circuit according to the first embodiment of the invention, capacitor CZ1 accumulates the charges corresponding to the pulse current. More specifically, the polarities of the pulse currents that are provided from capacitors C1P and C1N, respectively, are always opposite to each other, and flow into the opposite terminals of capacitor CZ1, respectively, so that capacitor CZ1 can absorb the pulse current. When capacitor CZ1 has a capacitance much larger than a sum of input capacitances CU1P and CU1N of latch circuit U1, an input capacitance CS1P of switch S2P and an input capacitance CS1N of switch S2N, the voltage that is caused between the terminals of capacitor CZ1 by the pulse current is extremely small. Thus, the charges that flow from capacitors C1P and C1N through switches S2P and S2N to the ground and the power supply decrease in quantity, and an unnecessary DC bias does not occur between the opposite terminals of capacitor CZ1. Thus, capacitor CZ1 changes the pulse currents into the same-phase components.

The pulse currents flow not only to capacitor CZ1 but also to input capacitances CU1P and CU1N of latch circuit U1, input capacitance CS1P of switch S2P and input capacitance CS1N of switch S2N. However, when capacitor CZ1 has an large capacitance, the charges, i.e., currents that flow through input capacitances CU1P and CU1N of latch circuit U1, input capacitance CS1P of switch S2P and input capacitance CS1N of switch S2N can be significantly reduced as compared with structure in which semiconductor integrated circuit 101 does not include capacitor CZ1.

Therefore, the semiconductor integrated circuit according to the first embodiment of the invention can prevent lowering of the offset voltages held by capacitors C1P and C1N, can prevent deterioration of the accuracy of the offset voltage correction and can improve the voltage comparison accuracy. Thus, the semiconductor integrated circuit according to the first embodiment of the invention can achieve the voltage amplifying operation with extremely high accuracy.

Usually, when the capacitor is connected to the output side of the amplifier circuit incorporated into the comparator circuit, the frequency characteristics of the comparator circuit deteriorate. Therefore, this structure is not employed unless it is necessary, e.g., to incorporate sample-and-hold operations into the comparator circuit. Thus, persons skilled in the art cannot have an idea of arranging capacitor CZ1 in semiconductor integrated circuit 101, without difficulty.

In the comparator circuit disclosed in the Patent Document 2, two capacitors each having one of terminals connected to a bias voltage are connected to differential paths between differential amplifiers (amplifier circuits) for incorporating the sample-and-hold operations into the comparator circuit, respectively. However, this structure loses a voltage for correcting the offset of the amplifier circuit. Therefore, it can be understood that the structure having capacitor CZ1 similarly to the semiconductor integrated circuit according to the first embodiment of the invention can be useful also in the comparator circuit disclosed in the Patent Document 2.

Figure 11:
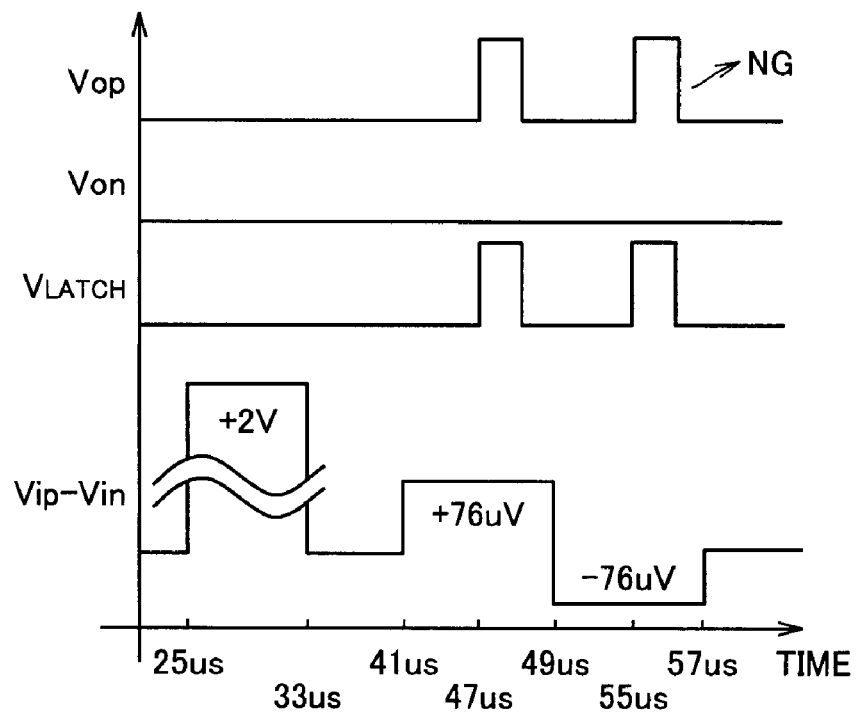
FIG. 11 is a waveform diagram illustrating a result obtained by simulating, with a circuit simulator, a voltage comparing operation of a semiconductor integrated circuit prepared by removing capacitor CZ1 from the semiconductor integrated circuit according to the first embodiment of the invention.

FIG. 11 is a waveform diagram illustrating a result obtained by simulating, with a circuit simulator, a voltage comparing operation of a semiconductor integrated circuit prepared by removing capacitor CZ1 from the semiconductor integrated circuit according to the first embodiment of the invention.

Referring to FIG. 11, a voltage difference between the differential input voltages received by this semiconductor integrated circuit is increased. Thus, a voltage difference that is represented by a rectangular wave of 2 V is applied, as differential input voltages, to the semiconductor integrated circuit during a period from 25 μs to 33 μs. This deteriorates the capability of correcting the offset voltage of the amplifier circuit arranged in the semiconductor integrated circuit as described before.

Then, input voltages Vip and Vin are set to (5 V+76 μV) and 5V during a period from 41 μs to 49 μs, respectively. During a period from 49 μs to 57 μs, input voltages Vip and Vin are set to (5 V−76 μV) and 5 V, respectively. During a period from 41 μs to 49 μs and a period from 49 μs to 57 μs, voltage VLATCH changes from the L-level to the H-level, and thereby the semiconductor integrated circuit performs the voltage comparing operation, respectively.

In this semiconductor integrated circuit not including capacitor CZ1, output voltages Vop and Von of latch circuit U1 attain the H- and L-levels, respectively, during a period from 41 μs to 49 μs in spite of the fact that input voltage Vip is smaller than input voltage Vin, and an obtained result of the voltage comparator is erroneous.

Figure 12:
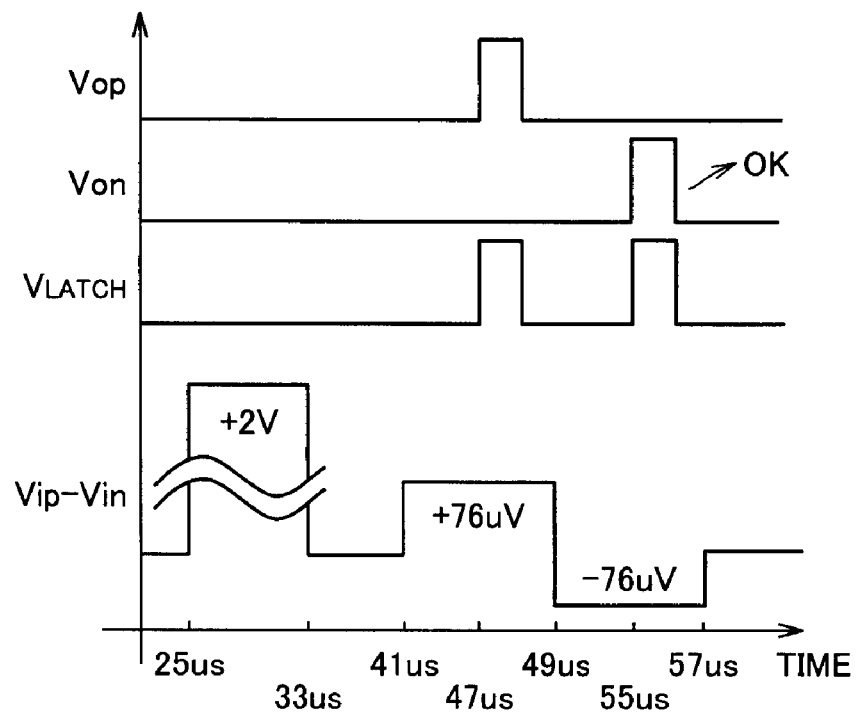
FIG. 12 is a waveform diagram illustrating a result obtained by simulating, with a circuit simulator, a voltage comparing operation of the semiconductor integrated circuit according to the first embodiment of the invention.

FIG. 12 is a waveform diagram illustrating a result obtained by simulating, with a circuit simulator, a voltage comparing operation of the semiconductor integrated circuit according to the first embodiment of the invention.

Referring to FIG. 12, the input voltages of semiconductor integrated circuit 101 are similar to those in FIG. 11. In the semiconductor integrated circuit according to the first embodiment of the invention, the correct results of the voltage comparison are obtained during a period from 41 μs to 49 μs and a period from 49 μs to 57 μs. Therefore, the semiconductor integrated circuit according to the first embodiment of the invention can achieve a determination accuracy of at least 76 μV.

Figure 13:
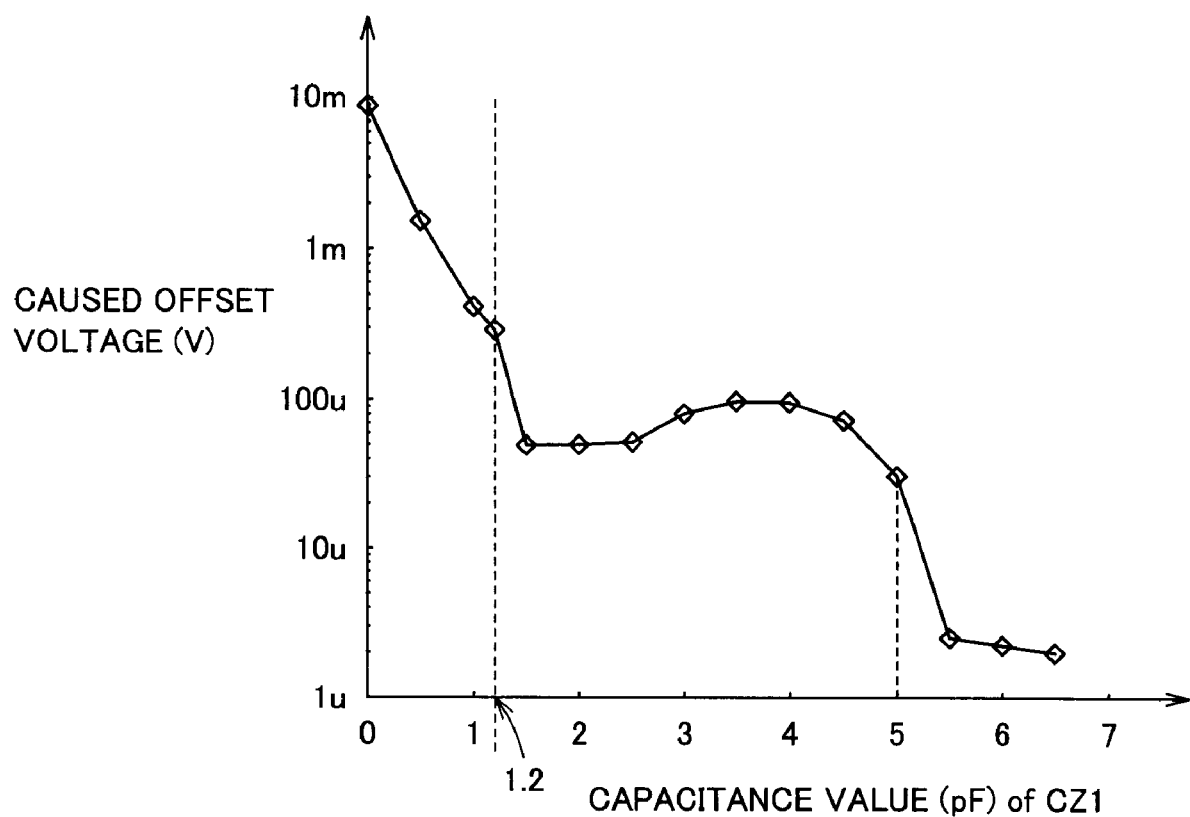
FIG. 13 is a graph illustrating a relationship between a capacitance value of capacitor CZ1 and an offset voltage of amplifier circuit A1.

FIG. 13 is a graph illustrating a relationship between the capacitance value of capacitor CZ1 and the offset voltage of amplifier circuit A1. FIG. 13 illustrates the offset voltages occurring in semiconductor integrated circuit 101 when capacitor CZ1 is removed, i.e., when capacitor CZ1 has a capacitance value of 0 pF, and when the capacitance value of capacitor CZ1 is swept from 0.5 pF to 6.5 pF.

When capacitance CZ1 has the capacitance value of 1.2 pF, the voltage comparing operation can be correctly performed on the differential input voltages of target values, i.e., (5 V±76 μV) and 5 V. Since capacitors C1P and C1N are set to 5 pF, the offset voltage decreases rapidly from the voltage in the case where capacitor CZ1 is set to 5 pF, as can be seen in FIG. 12. However, when capacitor CZ1 has an excessively large capacitance value, the gain of amplifier circuit A1 significantly decreases so that erroneous determination may occur.

Therefore, when capacitors CZ1 and C1P have capacitance values of CZ1 and C1P, respectively, the lower limit of capacitor CZ1 is represented by (C1P≦CZ1) in consideration of the offset voltage of amplifier circuit A1. This is because the charges generated in capacitors C1P and C1N can be absorbed by a capacitor having a capacitance equal to or larger than those of capacitors C1P and C1N.

An attenuation ratio of the gain of amplifier circuit A1 determined by capacitor CZ1 is represented by ($\alpha$=C1P/(2× C1P+CZ1) because the capacitance values of capacitors C1P and C1N are equal to each other. Assuming that a point where the amplifying capability of amplifier circuit A1 is lost is a limit point of capacitor CZ1, and that amplifier circuit A1 has the gain of A, a relationship of ($\alpha$×A≧1) must be satisfied. Therefore, the maximum value of capacitor CZ1 is represented by (CZ1≦(A−2)×C1P), where (A>2) must be satisfied.

From the foregoing relationships, the set range of capacitor CZ1 is represented by (C1P≦CZ1≦(A−2)×C1P). When capacitor CZ1 has a large capacitance value, the frequency characteristics and the response speed of amplifier circuit A1 deteriorate, and therefore it is desired that the capacitance value of capacitor CZ1 is close to the capacitance value of capacitor C1P.

In the comparator circuit disclosed in the Patent Document 3, only the limitation that is imposed on the output voltage amplitude using diode-connected P-channel MOS transistors is present as the design item relating to the output of the amplifier circuit. Therefore, in the comparator circuit disclosed in the Patent Document 3, the charges of the capacitor holding the offset voltage of amplifier circuit A1 are lost when the voltage difference between the differential input voltages is large, and therefore the voltage correcting accuracy of the comparator circuit deteriorates.

In the comparator circuit disclosed in the Patent Document 1, the capacitor is arranged between the outputs of the two MOS transistors in a compensation current producing circuit that cancels the capacitance between the gate and drain of the MOS transistor arranged for differential input. Therefore, the comparator circuit disclosed in the Patent Document 1 does not use the phenomenon in which two MOS transistors in the output stage of the differential amplifier circuit provide pulse currents of the opposite phases, and is quite different from the semiconductor integrated circuit according to the first embodiment of the invention.

When the comparator circuit disclosed in the Patent Document 1 receives the comparison target voltages of a large voltage difference, the voltage held by the two capacitors lowers, and the accuracy of the offset voltage correction deteriorates. Conversely, the semiconductor integrated circuit according to the first embodiment of the invention includes capacitor CZ1 between the positive- and reverse-phase output terminals of amplifier circuit A1. This structure can prevent such a situation that the pulse current flowing from the capacitor holding the voltage for correcting the offset voltage flows to the ground, power supply or the like. Therefore, the semiconductor integrated circuit according to the first embodiment of the invention can prevent the deterioration of the accuracy of the offset voltage correction, and can improve the voltage comparison accuracy.

Another embodiment of the invention will now be described with reference to the drawings. In the figures, the same or corresponding portions bear the same reference numbers, and description thereof is not repeated.

Second Embodiment

A second embodiment relates to a semiconductor integrated circuit that is different from that according to the first embodiment in that amplifier circuits are arranged in a plurality of stages. The semiconductor integrated circuit according to the second embodiment is substantially the same as that according to the first embodiment except for details described below.

Figure 14:
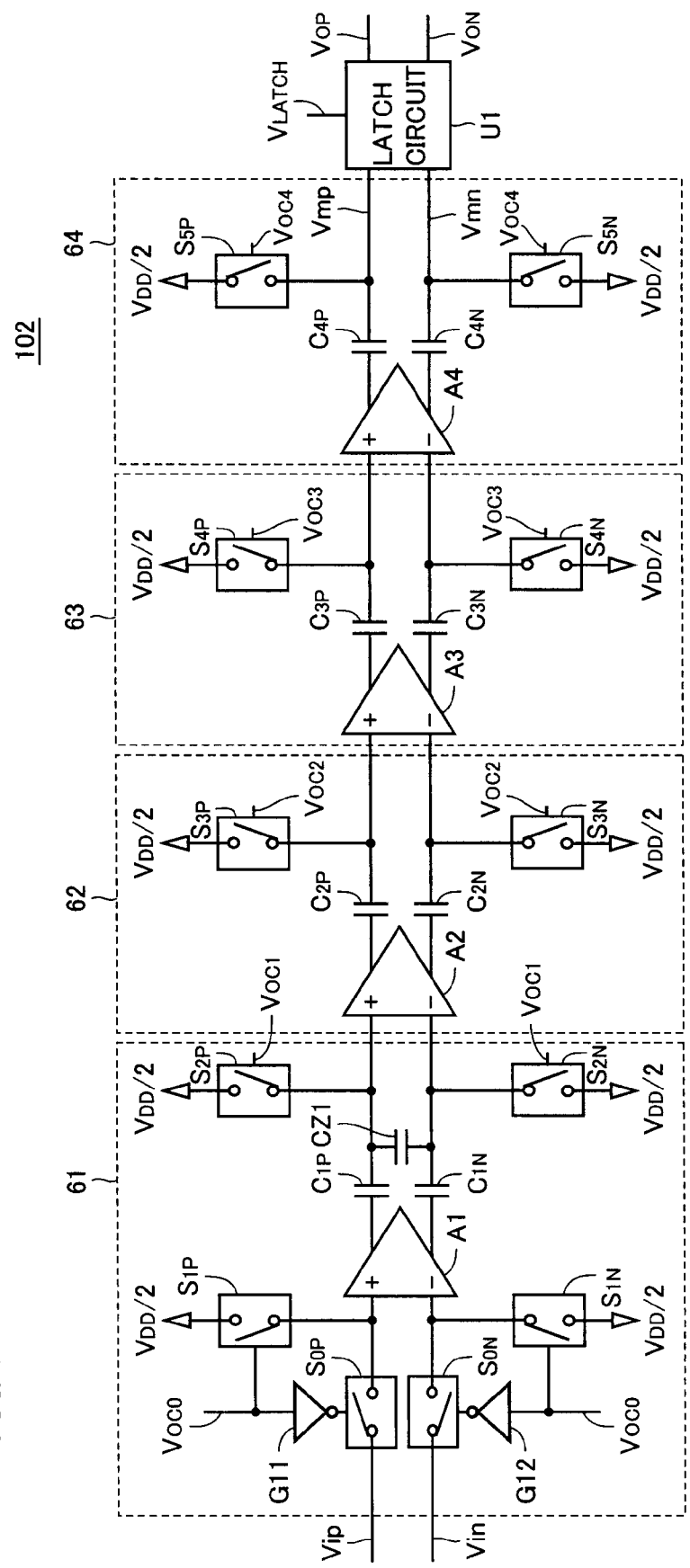
FIG. 14 shows a structure of a semiconductor integrated circuit according to a second embodiment of the invention.

FIG. 14 shows a structure of the semiconductor integrated circuit according to the second embodiment of the invention.

Referring to FIG. 14, a semiconductor integrated circuit 102 is an OSS type of comparator circuit, and includes amplifying units 61-64 and latch circuit U1. Amplifying unit 61 includes amplifier circuit (first differential amplifier circuit) A1, inverter circuits G11 and G12, capacitors (first, second and third capacitors) C1P, C1N and CZ1, switches S0P and S1P, switch (first switches) S2P, switches S0N and S1N, and switch (second switch) S2N. Amplifying unit 62 includes an amplifier circuit (second differential amplifier circuit) A2, capacitors (fourth and fifth capacitors) C2P and C2N, and switches (third and fourth switches) S3P and S3N. Amplifying unit 63 includes an amplifier circuit A3, capacitors C3P and C3N, and switches S4P and S4N. Amplifying unit 64 includes an amplifier circuit A4, capacitors C4P and C4N, and switches S5P and S5N.

In amplifying unit 61, switch S0P has the first terminal receiving input voltage Vip and the second terminal connected to the positive-phase input terminal (first input terminal) of amplifier circuit A1 and the first terminal of switch S1P.

Switch S0N has the first terminal receiving input voltage Vin and the second terminal connected to the reverse-phase input terminal (second input terminal) of amplifier circuit A1 and the first terminal of switch S1N.

Capacitor C1P has the first terminal connected to the positive-phase output terminal (first output terminal) of amplifier circuit A1 and the second terminal connected to the first terminal of capacitor CZ1 and the first terminal of switch S2P.

Capacitor C1N has the first terminal connected to the reverse-phase output terminal of amplifier circuit A1 and the second terminal connected to the second terminal of capacitor CZ1 and a first terminal of switch S2N.

A voltage equal to half the fixed voltage VDD is applied to the second terminals of switches S1P, S2P, S1N and S2N.

Inverter circuits G11 and G12 invert the logical level of control voltage VOC0 and output it.

Switches S0P and S0N are turned on/off based on control voltage VOC0 having the logical levels inverted by inverter circuits G11 and G12. Thus, switches S0P and S0N select the connection and disconnection of the first and second terminals. Switches S1P and S1N are turned of/off based on control voltage VOC0. Switches S2P and S2N are turned on/off based on control voltage VOC1. In the following description, the switches such as switches S0P-S2P and S0N-S2N are turned on when the control voltage is at the H-level, and are turned off when the control voltage is at the L-level.

Amplifier circuit A1 amplifies input voltages Vip and Vin received through respective switches S0P and S0N, and outputs it.

In amplifying unit 62, amplifier circuit A2 has a positive-phase input terminal connected to the second terminal of capacitor C1P and a reverse-phase input terminal connected to the second terminal of capacitor C1N.

Capacitor C2P has a first terminal connected to the positive-phase output terminal of amplifier circuit A2 and a second terminal connected to a first terminal of switch S3P. Capacitor C2N has a first terminal connected to the reverse-phase output terminal of amplifier circuit A2 and a second terminal connected to a first terminal of switch S3N.

Switches S3P and S3N receive half the fixed voltage VDD on their second terminals. Switches S3P and S3N are turned on/off based on a control voltage VOC2.

Amplifier circuit A2 amplifies a voltage received through capacitor C1P from the positive-phase output terminal of amplifier circuit A1 and a voltage received through capacitor C1N from the reverse-phase output terminal of amplifier circuit A1.

In amplifying unit 63, amplifier circuit A3 has a positive-phase input terminal coupled to the second terminal of capacitor C2P and a reverse-phase input terminal coupled to the second terminal of capacitor C2N.

Capacitor C3P has a first terminal connected to the positive-phase output terminal of amplifier circuit A3 and a second terminal connected to a first terminal of switch S4P. Capacitor C3N has a first terminal connected to the reverse-phase output terminal of amplifier circuit A3 and a second terminal connected to a first terminal of switch S4N.

Switches S4P and S4N receive on their second terminals a voltage equal to half the fixed voltage VDD. Switches S4P and S4N are turned on/off based on a control voltage VOC3.

Amplifier circuit A3 amplifies the voltage received from the positive-phase output terminal of amplifier circuit A2 through capacitor C2P and the voltage received from the reverse-phase output terminal of amplifier circuit A2 through capacitor C2N, and outputs them.

In amplifier circuit 64, amplifier circuit A4 has a positive-phase input terminal coupled to the second terminal of capacitor C3P and a reverse-phase input terminal coupled to the second terminal of capacitor C3N.

Capacitor C4P has a first terminal connected to the positive-phase output terminal of amplifier circuit A4 and a second terminal connected to a first terminal of switch S5P. Capacitor C4N has a first terminal connected to the reverse-phase output terminal of amplifier circuit A4 and a second terminal connected to a first terminal of switch S5N.

Switches S5P and S5N receive on their second terminals a voltage equal to half the fixed voltage VDD, and are turned on/off based on a control voltage VOC4.

Amplifier circuit A4 amplifies the voltage received from the positive-phase output terminal of amplifier circuit A3 through capacitor C3P and the voltage received from the reverse-phase output terminal of amplifier circuit A3 through capacitor C3N, and outputs them.

Latch circuit U1 performs a comparison between voltage Vmp received from the positive-phase output terminal of amplifier circuit A4 through capacitor C4P and voltage Vmn received from the reverse-phase output terminal of amplifier circuit A4 through capacitor C4N, holds a digital signal at the H- or L-level indicative of a result of the comparison and outputs this digital signal as output voltages VOP and VON.

Figure 15:
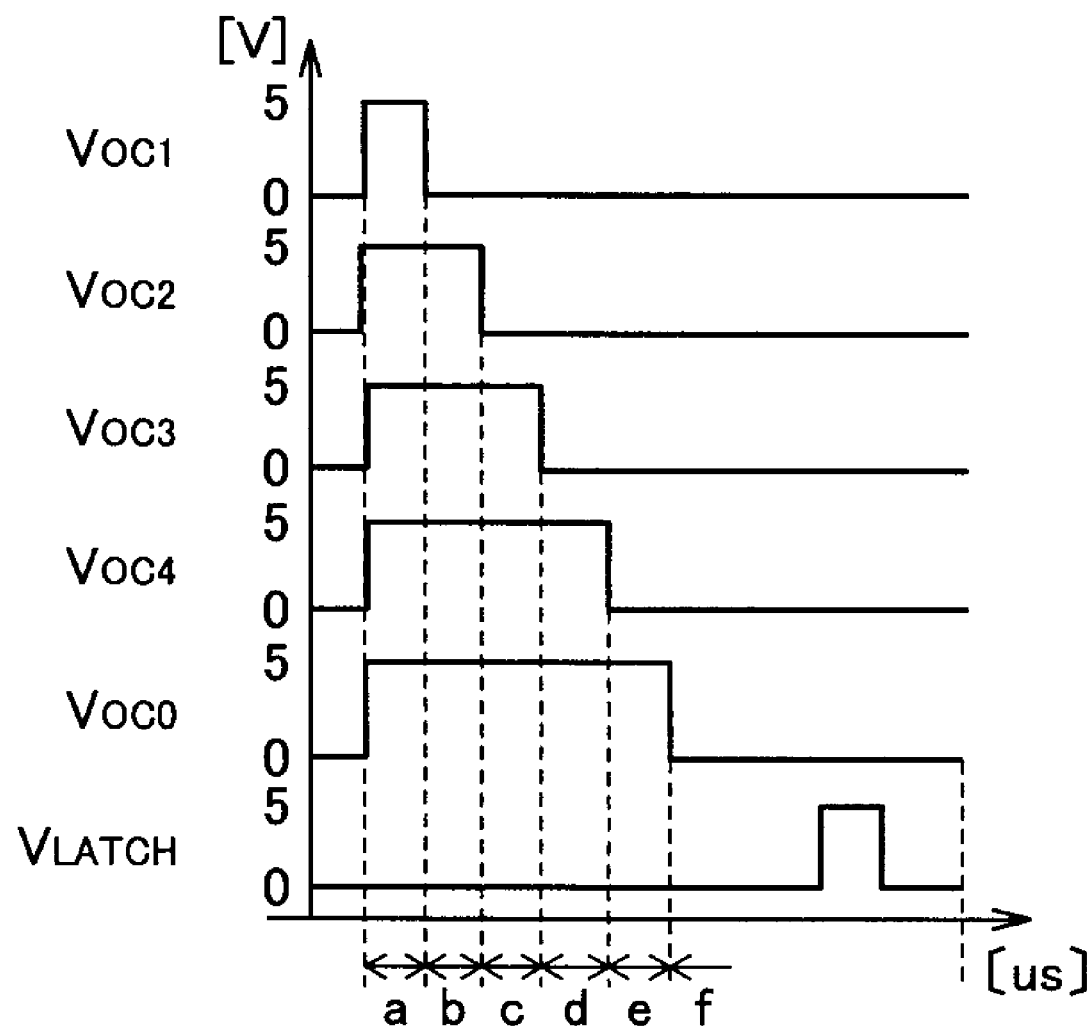
FIG. 15 is a waveform diagram illustrating an operation of the semiconductor integrated circuit according to a second embodiment of the invention.

FIG. 15 is a waveform diagram illustrating an operation of the semiconductor integrated circuit according to the second embodiment of the invention.

In period a, the correcting operation for the offset voltage of amplifier circuit A1 is performed similarly to the semiconductor integrated circuit according to the first embodiment of the invention. More specifically, control voltages VOC0-VOC4 attain the H-level, and control voltage VLATCH attains the L-level. Thereby, switches S0P and S0N are turned off, switches S1P-S5P are turned on and switches S1N-S5N are turned on. At this point in time, VDD/2 is applied to the differential inputs and differential outputs of amplifier circuit A1. Therefore, capacitors C1P and C1N accumulate charges corresponding to the voltage obtained by multiplying the offset voltage of amplifier circuit A1 by the gain of amplifier circuit A1.

In period b, control voltage VOC1 attains the L-level, control voltages VOC0 and VOC2-VOC4 attain the H-level and control voltage VLATCH attains the L-level. Thereby, switches S2P and S2N change from the on state to the off state. Thus, switches S0P, S0N, S2P and S2N are off, switches S1P and S3P-S5P are on and switches S1N and S3N-S5N are on. At this point, the offset voltage of amplifier circuit A1 held by capacitors C1P and C1N is fixed.

In period c, control voltages VOC1 and VOC2 attain the L-level, control voltages VOC0, VOC3 and VOC4 attain the H-level and control voltage VLATCH attains the L-level. Thereby, switches S3P and S3N change from the on state to the off state. Thus, switches S0P, S0N, S2P, S2N, S3P and S3N are off, switches S1P, S4P and S5P are on and switches S1N, S4N and S5N are on. At this point, the offset voltage of amplifier circuit A2 held by capacitors C2P and C2N is fixed.

In period d, control voltages VOC1-VOC3 attain the L-level, control voltage VOC0 and VOC4 attain the H-level and control voltage VLATCH attains the L-level. Thereby, switches S4P and S4N change from the on state to the off state. Thus, switches S0P, S0N, S2P-S4P and S2N-S4N are off, switches S1P and S5P are on and switches S1N and S5N are on. At this point, the offset voltage of amplifier circuit A3 held by capacitors C3P and C3N is fixed.

In a period e, control voltages VOC1-VOC4 attain the L-level, control voltage VOC0 attains the H-level and control voltage VLATCH attains the L-level. Thereby, switches S5P and S5N change from the on state to the off state. Thus, switches S0P, S0N, S2P-S5P and S2N-S5N are off, switch S1P is on and switch S1N is on. At this point, the offset voltage of amplifier circuit A4 held by capacitors C4P and C4N is fixed.

In a period f, control voltages VOC0-VOC4 attain the L-level, and control voltage VLATCH attains the H-level. Thereby, switches S1P and S1N change from the on state to the off state, and switches S0P and S0N change from the off state to the on state. Thus, switches S1P-S5P and S1N-S5N are off, and switches S0P and S0N are on. Thereby, semiconductor integrated circuit 102 can perform the voltage comparing operation on input voltages Vip and Vin.

Therefore, the semiconductor integrated circuit according to the second embodiment of the invention can cancel the offset voltages of amplifier circuits A1-A4 in the output voltages of amplifier circuits A1-A4.

It is generally difficult in the OOS type comparator circuit to increase the gain per amplifying unit, i.e., per amplifier circuit. This is because the output voltage is saturated only by amplifying the offset voltage of the amplifier circuit itself in some cases. However, the semiconductor integrated circuit according to the second embodiment of the invention employs the amplifier circuits in multiple stages, and thereby can relieve the required determination conditions for the voltage comparison in latch circuit U1 so that the voltage comparison accuracy of the semiconductor integrated circuit can be improved as compared with the semiconductor integrated circuit according to the first embodiment of the invention.

Semiconductor integrated circuit 102 has the four amplifying units. However, this structure is not restrictive, and an arbitrary number of amplifying units can be employed.

For example, when control voltage VOC1 changes from the H-level to the L-level in period b, amplifying unit 61 ends the correcting operation. At this point in time, charge injection occurs in switches S2P and S2N, and thus switches S2P and S2N are charged or discharged. Thereby, amplifier circuit A2 outputs the voltage including a voltage that is caused by the charge injection. However, the semiconductor integrated circuit according to the second embodiment of the invention changes control voltage VOC2 from the H-level to the L-level in period c following period b, and ends the correcting operation of amplifying unit 62. Owing to these structures, capacitors C2P and C2N can hold the voltage canceling the offset voltage in amplifier circuit A2 itself as well as the voltage canceling the voltages that are provided from amplifier circuit A2 corresponding to the charge injection in switches S2P and S2N. Also, a similar effect can be achieved in connection with amplifying unit 63 in period d and amplifying unit 64 in period e. Therefore, the semiconductor integrated circuit according to the second embodiment of the invention can improve its voltage comparison accuracy as compared with the semiconductor integrated circuit according to the first embodiment of the invention.

Still another embodiment of the invention will now be described with reference to the drawings. In the figures, the same or corresponding portions bear the same reference numbers, and description thereof is not repeated.

Third Embodiment

This embodiment relates to a semiconductor integrated circuit in which each amplifying unit corresponding to that in the semiconductor integrated circuit according to the second embodiment employs a capacitor as a measure concerning the pulse current. The semiconductor integrated circuit according to the third embodiment is substantially the same as that according to the second embodiment except for the details described below.

Figure 16:
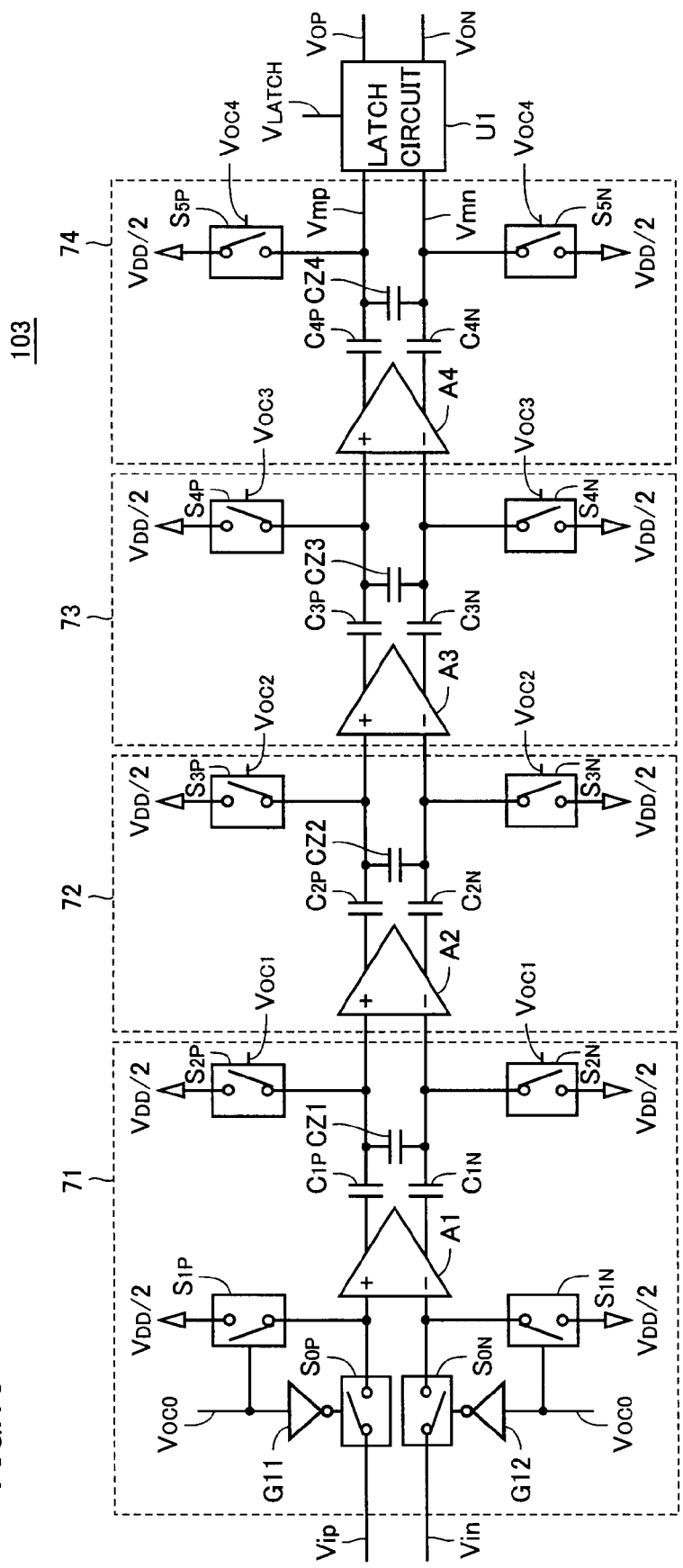
FIG. 16 shows a structure of a semiconductor integrated circuit according to a third embodiment of the invention.

FIG. 16 shows a structure of a semiconductor integrated circuit according to a third embodiment of the invention.

Referring to FIG. 16, a semiconductor integrated circuit 103 is an OOS type comparator circuit, and includes amplifying units 71-74 and latch circuit U1. Amplifying unit 71 has substantially the same structure as amplifying unit 61. Amplifying units 72-74 differs from amplifying units 62-64 in the semiconductor integrated circuit according to the second embodiment of the invention in that amplifying units 72-74 further include capacitors CZ2-CZ4, respectively.

In amplifying unit 72, capacitor (sixth capacitor) CZ2 has a first terminal coupled to the second terminal of capacitor C2P and a second terminal coupled to the second terminal of capacitor C2N. In amplifying unit 73, capacitor CZ3 has a first terminal coupled to the second terminal of capacitor C3P and a second terminal coupled to the second terminal of capacitor C3N. In amplifying unit 74, capacitor CZ4 has a first terminal coupled to the second terminal of capacitor C4P and a second terminal coupled to the second terminal of capacitor C4N.

A waveform diagram illustrating the operation of semiconductor integrated circuit 103 is substantially the same as that of FIG. 15 illustrating the operation of the semiconductor integrated circuit according to the second embodiment of the invention. Thus, the operations of semiconductor integrated circuit 103 other than those of capacitors CZ2-CZ4 are substantially the same as those of the semiconductor integrated circuit according to the second embodiment of the invention, and therefore description of the substantially same operations is not repeated.

In the semiconductor integrated circuit according to the third embodiment of the invention, amplifying units 72-74 in the second and subsequent stages include capacitors CZ2-CZ4, respectively. Thus, each amplifying unit has taken measures for the case where the amplitude difference of the differential input voltages of the amplifying unit is large. Even when a certain amplifier circuit rapidly reproduces a voltage and outputs a voltage having an amplitude that steeply changes, the above structure can prevent such a situation that the voltages for correcting the offset voltage of the amplifier circuit are lost in the amplifying unit in the next stage, and the structure can amplify and transmit the voltages received from the amplifying unit in the preceding stage to the amplifying unit in the next stage.

In the semiconductor integrated circuit according to the third embodiment of the invention, even when an output voltage of the amplifying unit is saturated to exhibit a rectangular waveform, the correction accuracy for the offset voltage of the amplifier circuit does not deteriorate in the subsequent amplifying unit. Accordingly, the semiconductor integrated circuit according to the third embodiment of the invention can further improve the voltage comparison accuracy of the semiconductor integrated circuit as compared with the semiconductor integrated circuit according to the second embodiment of the invention.

Yet another embodiment of the invention will now be described with reference to the drawings. In the figures, the same or corresponding portions bear the same reference numbers, and description thereof is not repeated.

Fourth Embodiment

A fourth embodiment relates to a semiconductor integrated circuit different in type from the semiconductor integrated circuit according to the first embodiment. The semiconductor integrated circuit according to this embodiment is substantially the same as that according to the first embodiment except for the following details.

Figure 17:
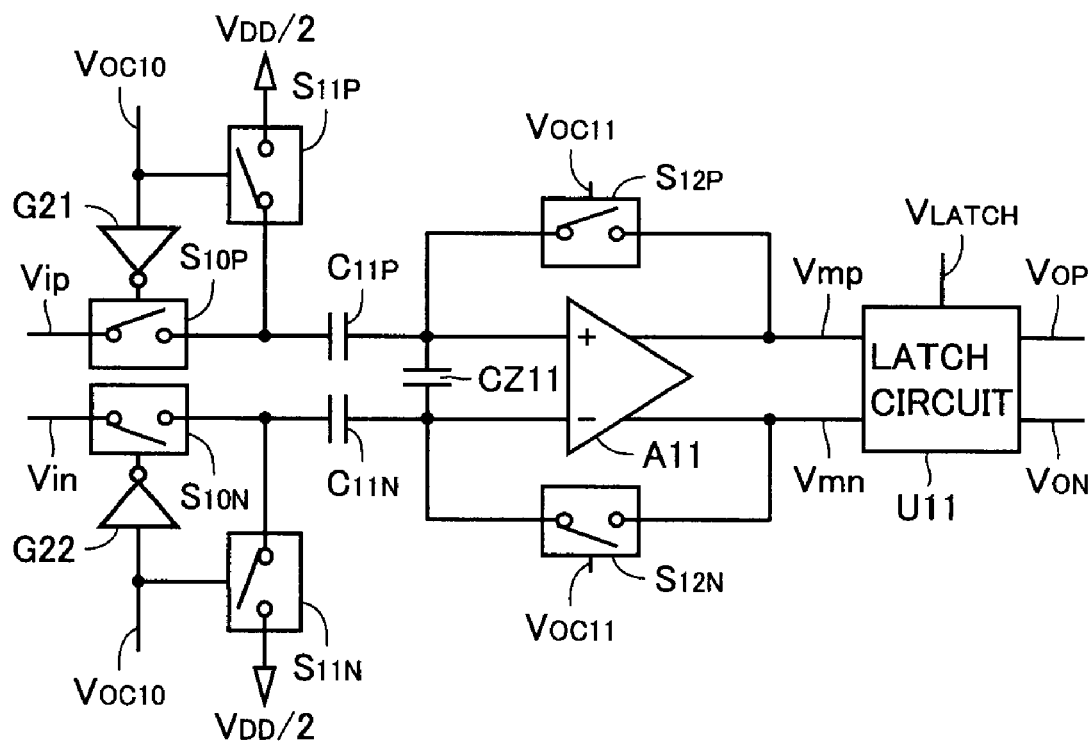
FIG. 17 shows a structure of a semiconductor integrated circuit according to a fourth embodiment of the invention.

FIG. 17 shows a structure of a semiconductor integrated circuit according to a fourth embodiment of the invention.

Referring to FIG. 17, a semiconductor integrated circuit 104 is an IOS (Input Offset Storage) type of comparator circuit, and includes an amplifier circuit (differential amplifier circuit) A11, inverter circuits G21 and G22, capacitors (first, second and third capacitors) C11P, C11N and CZ11, switches S10P and S11P, a switch (first switch) S12P, switches S10N and S11N, a switch (second switch) S12N and a latch circuit U11. Switches S10P-S12P and S10N-S12N may be achieved using complementary switches formed of combinations, e.g., of N- and P-channel MOS transistors as well as N- and P-channel MOS transistors.

Switch S10P has a first terminal receiving input voltage Vip and a second terminal connected to a first terminal of capacitor C11P and a first terminal of switch S11P.

Switch S10N has a first terminal receiving input voltage Vin and a second terminal connected to a first terminal of capacitor C11N and a first terminal of switch S11N.

Amplifier circuit A11 has a positive-phase input terminal (first input terminal) connected to a second terminal of capacitor C11P, a first terminal of switch S12P and a first terminal of capacitor CZ11, and has a reverse-phase input terminal (second input terminal) connected to a second terminal of capacitor C11N, a first terminal of switch S12N and a second terminal of capacitor CZ11. Also, amplifier circuit A11 has a positive-phase output terminal (first output terminal) connected to a second terminal of switch S12P and a positive-phase input terminal of latch circuit U11, and has a reverse-phase output terminal (second output terminal) connected to a second terminal of switch S12N and a reverse-phase input terminal of latch circuit U11.

Switches S11P and S11N receive on their second terminals a voltage equal to half the fixed voltage VDD.

Each of inverter circuits G21 and G22 inverts a logical level of a control voltage VOC10 and outputs it.

Switches S10P and S10N are turned on/off based on control voltages VOC10 having the logical levels inverted by inverter circuits G21 and G22, respectively. Switches S11P and S11N are turned on/off based on control voltage VOC10. Switches S12P and S12N are turned on/off based on a control voltage VOC11. In the following description, switches S10P-S12P and S10N-S12N are turned on when the control voltage is at the H-level, and are turned off when the control voltage is at the L-level.

Amplifier circuit A11 amplifies input voltage Vip received through switch S10P and capacitor C11P as well as input voltage Vin received through switch S10N and capacitor C11N, and outputs them.

Latch circuit U11 performs a comparison between voltage Vmp received from the positive-phase output terminal of amplifier circuit A11 and voltage Vmn received from the reverse-phase output terminal of amplifier circuit A11 through capacitor C11N, holds a digital signal at the H- or L-level indicative of a result of the comparison and outputs this signal as output voltages VOP and VON.

Figure 18:
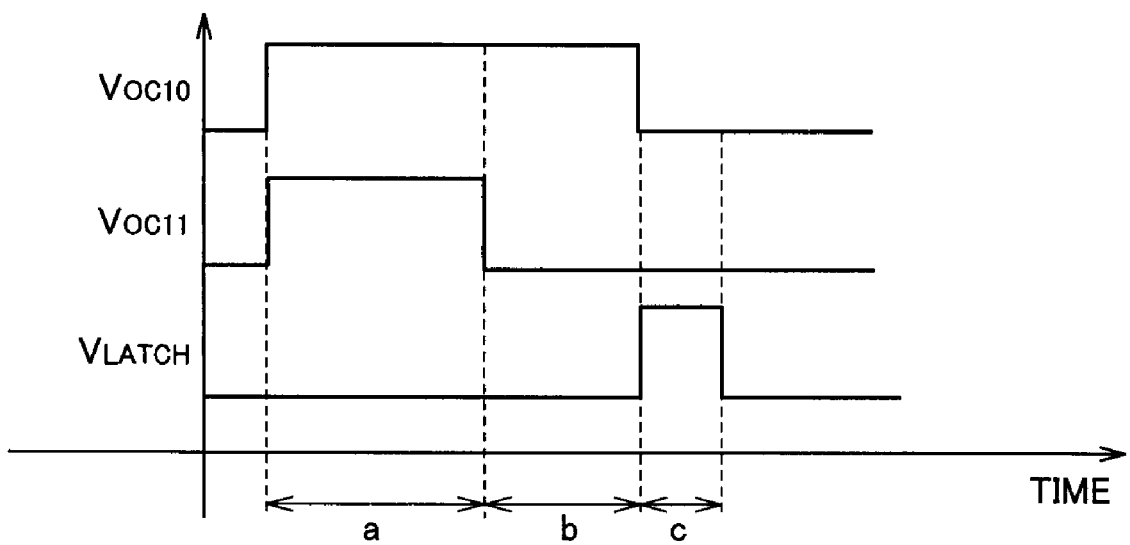
FIG. 18 is a waveform diagram illustrating an operation of the semiconductor integrated circuit according to the fourth embodiment of the invention.

FIG. 18 is a waveform diagram insulating an operation of the semiconductor integrated circuit according to the fourth embodiment of the invention.

In period a, the correcting operation for the offset voltage of amplifier circuit A11 is performed similarly to the semiconductor integrated circuit according to the first embodiment of the invention. More specifically, control voltages VOC10 and VOC11 attain the H-level, and control voltage VLATCH attains the L-level. Thereby, switches S10P and S10N are turned off, and switches S11P, S12P, S11N and S12N are turned on. At this point, capacitors C11P and C11N accumulate charges corresponding to the offset voltage of amplifier circuit A11.

In period b, control voltages VOC10 and VOC11 attain the H- and L-levels, respectively, and control voltage VLATCH attains the L-level. Thereby, switches S12P and S12N change from the on state to the off state. Thus, switches S10P, S10N, S12P and S12N are off, and switches S11P and S11N are on. At this point, the offset voltage of amplifier circuit A11 held by capacitors C11P and C11N is fixed.

In period c, control voltages VOC10 and VOC11 attain the L-level, and control voltage VLATCH attains the H-level. Thereby, switches S11P and S11N change from the on state to the off state, and switches S10P and S10N change from the off state to the on state. Thus, switches S11P, S12P, S11N and S12N are off, and switches S10P and S10N are on. Thereby, semiconductor integrated circuit 104 can perform the voltage comparing operation on input voltages Vip and Vin.

Therefore, the semiconductor integrated circuit according to the fourth embodiment of the invention can cancel the offset voltage in the output voltages of amplifier circuit A11.

In the semiconductor integrated circuit according to the fourth embodiment of the invention, capacitor CZ11 is arranged between the positive- and reverse-phase input terminals of amplifier circuit A11. This structure can prevent such a situation that the pulse currents flowing from capacitors C11P and C11N holding the voltages for correcting the offset voltage flow to the ground, power supply and the like. Therefore, the semiconductor integrated circuit according to the fourth embodiment of the invention can prevent deterioration of the accuracy of the offset voltage correction, similarly to the semiconductor integrated circuit according to the first embodiment of the invention, and therefore the voltage comparison accuracy can be improved.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor integrated circuit comprising:
a first differential amplifier circuit having a first input terminal receiving a first input voltage, a second input terminal receiving a second input voltage, a first output terminal and a second output terminal;
a first capacitor having a first terminal coupled to the first output terminal of said first differential amplifier circuit and a second terminal;
a second capacitor having a first terminal coupled to the second output terminal of said first differential amplifier circuit and a second terminal;
a first switch having a first terminal coupled to the second terminal of said first capacitor and a second terminal receiving a predetermined voltage, and selecting connection and disconnection of said first and second terminals of said first switch;
a second switch having a first terminal coupled to the second terminal of said second capacitor and a second terminal receiving a predetermined voltage, and selecting connection and disconnection of said first and second terminals of said second switch;
a third capacitor having a first terminal coupled to the second terminal of said first capacitor and a second terminal coupled to the second terminal of said second capacitor; and
a latch circuit comparing a voltage received from the first output terminal of said first differential amplifier circuit through said first capacitor and a voltage received from the second output terminal of said first differential amplifier circuit through said second capacitor and providing a digital signal representing a result of a comparison between said first and second input voltages.

2. The semiconductor integrated circuit according to claim 1, further comprising:

a second differential amplifier circuit having a first input terminal coupled to the second terminal of said first capacitor, a second input terminal coupled to the second terminal of said second capacitor, a first output terminal and a second output terminal;
a fourth capacitor having a first terminal coupled to the first output terminal of said second differential amplifier circuit and a second terminal;
a fifth capacitor having a first terminal coupled to the second output terminal of said second differential amplifier circuit and a second terminal;
a third switch having a first terminal coupled to the second terminal of said fourth capacitor and a second terminal receiving a predetermined voltage, and selecting connection and disconnection of said first and second terminals of said third switch; and
a fourth switch having a first terminal coupled to the second terminal of said fifth capacitor and a second terminal receiving a predetermined voltage, and selecting connection and disconnection of said first and second terminals of said fourth switch, wherein
said latch circuit compares a voltage received from the first output terminal of said second differential amplifier circuit through said fourth capacitor and a voltage received from the second output terminal of said second differential amplifier circuit through said fifth capacitor and provides the digital signal representing the result of the comparison between said first and second input voltages based thereon.

3. The semiconductor integrated circuit according to claim 2, further comprising:
a sixth capacitor having a first terminal coupled to the second terminal of said fourth capacitor and a second terminal coupled to the second terminal of said fifth capacitor.

4. A semiconductor integrated circuit comprising:
a first capacitor having a first terminal receiving a first input voltage and a second terminal;
a second capacitor having a first terminal receiving a second input voltage and a second terminal;
a differential amplifier circuit having a first terminal coupled to the second terminal of said first capacitor, a second input terminal coupled to the second terminal of said second capacitor, a first output terminal and a second output terminal;
a first switch having a first terminal coupled to the second terminal of said first capacitor and a second terminal coupled to the first output terminal of said differential amplifier circuit, and selecting connection and disconnection of said first and second terminals of said first switch;
a second switch having a first terminal coupled to the second terminal of said second capacitor and a second terminal coupled to the second output terminal of said differential amplifier circuit, and selecting connection and disconnection of said first and second terminals of said second switch;
a third capacitor having a first terminal coupled to the first input terminal of said differential amplifier circuit and a second terminal coupled to the second input terminal of said differential amplifier circuit; and
a latch circuit comparing a voltage received from the first output terminal of said differential amplifier circuit and a voltage received from the second output terminal of said differential amplifier circuit and providing a digital signal representing a result of a comparison between said first and second input voltages.

* * * * *